(12) United States Patent
Seo et al.

(10) Patent No.: US 7,998,787 B2
(45) Date of Patent: Aug. 16, 2011

(54) THIN FILM TRANSISTOR INCLUDING ORGANIC SEMICONDUCTOR LAYER AND SUBSTRATE INCLUDING THE SAME

(75) Inventors: Hyun-Sik Seo, Annyang-si (KR); Nack-Bong Choi, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 730 days.

(21) Appl. No.: 11/397,555

(22) Filed: Apr. 5, 2006

(65) Prior Publication Data
US 2006/0226441 A1 Oct. 12, 2006

(30) Foreign Application Priority Data
Apr. 6, 2005 (KR) .................. 10-2005-0028348

(51) Int. Cl.
*H01L 51/40* (2006.01)

(52) U.S. Cl. .................. 438/99; 257/E51.006

(58) Field of Classification Search .................. 257/40, 257/E51.001–E51.052, E27.117–E27.119; 438/99
See application file for complete search history.

(56) References Cited

U.S. PATENT DOCUMENTS

| 6,111,361 | A * | 8/2000 | Xu et al. .................. 315/169.1 |
| 6,555,411 | B1 * | 4/2003 | Bao et al. .................. 438/99 |
| 7,256,064 | B2 * | 8/2007 | Hanna et al. .................. 438/82 |
| 7,566,899 | B2 * | 7/2009 | Chabinyc et al. .................. 257/40 |
| 2003/0112382 | A1 * | 6/2003 | Takahashi et al. .................. 349/43 |
| 2003/0173894 | A1 * | 9/2003 | Choi et al. .................. 313/504 |
| 2004/0012017 | A1 * | 1/2004 | Nagayama .................. 257/40 |
| 2004/0108562 | A1 * | 6/2004 | Nagayama et al. .................. 257/434 |
| 2004/0134878 | A1 * | 7/2004 | Matsushita et al. .................. 216/23 |
| 2005/0057136 | A1 * | 3/2005 | Moriya et al. .................. 313/311 |
| 2005/0140307 | A1 * | 6/2005 | Park .................. 315/169.3 |
| 2006/0214154 | A1 * | 9/2006 | Yang et al. .................. 257/40 |

OTHER PUBLICATIONS

Cui, J., et al. "Indium Tin Oxide Alternatives—High Work Function Transparent Conducting Oxides as Anodes for Organic Light Emitting Diodes." Adv. Mater., vol. 13, No. 19 (Oct. 2, 2001): pp. 1476-1480.*
Choi, N.-B., et al. "Novel Surface Modification of Indium-Tin-Oxide Films Using Ion Implantation for Organic Light-Emitting Diodes." Jpn. J. Appl. Phys., vol. 43, No. 8A (2004): 5516-5519.*
Knipp, D., et al. "Polycrystalline Pentacene Thin Films for Large Area Electronic Applications." J. Non-Cryst. Sol., vol. 299-302 (2002): pp. 1042-1046.*
Martin, S., et al. "Gate-Planarized Organic Polymer Thin Film Transistors." J. Elect. Mater., vol. 31, No. 5 (2002): pp. 512-519.*
Canhola, P., et al."Role of Annealing Environment on the Performances of Large Area ITO Films Produced by RF Magnetron Sputtering." Thin Sol. Films, vol. 487 (2005): pp. 271-276.*

* cited by examiner

*Primary Examiner* — Matthew W Such
(74) *Attorney, Agent, or Firm* — Birch, Stewart, Kolasch & Birch, LLP

(57) ABSTRACT

Provided is a thin film transistor including a gate electrode on a substrate; a gate insulating layer on the gate electrode; source and drain electrodes including first source and drain layers on the gate insulating layer, respectively, and spaced apart from each other, wherein at lease one of the first source and drain layers includes indium-tin-oxide doped with at least one Group III element; and an organic semiconductor layer on the gate insulating layer and contacting the first source and drain layers.

6 Claims, 8 Drawing Sheets

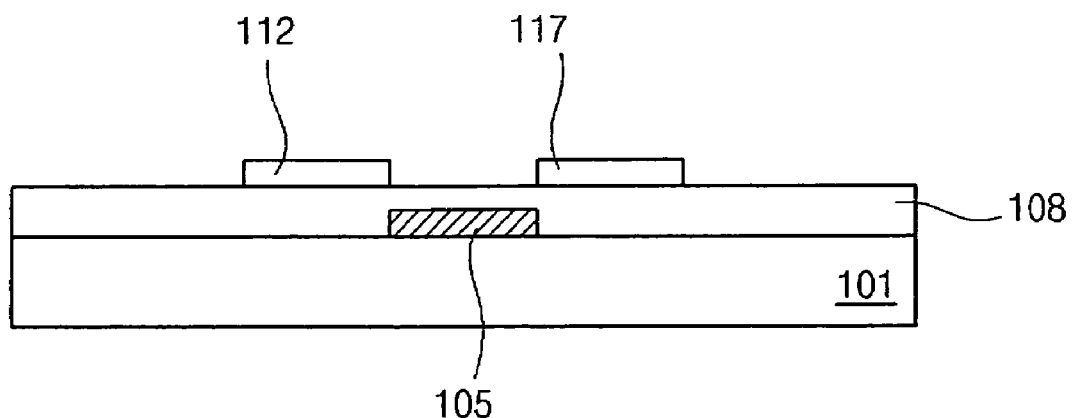
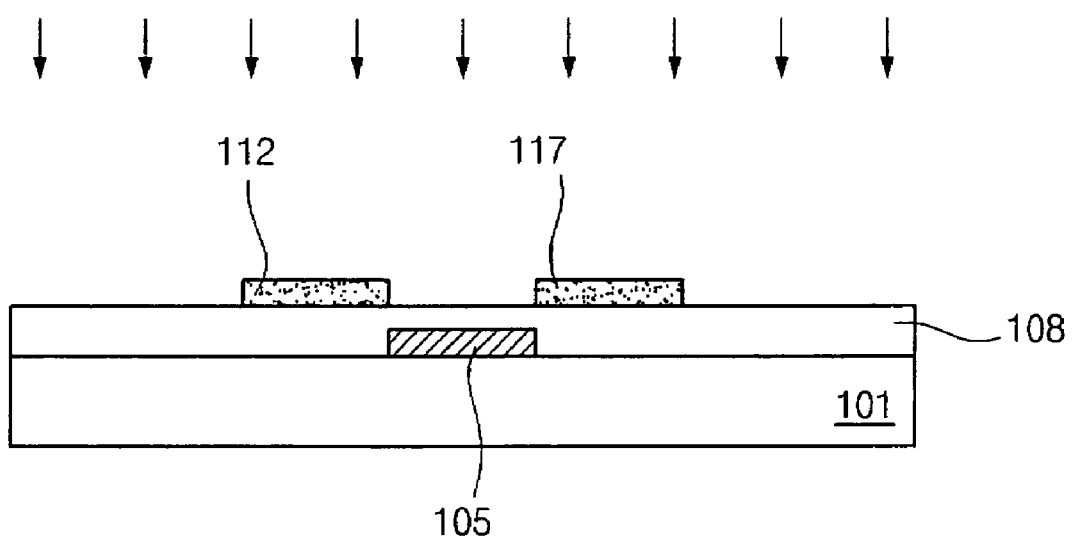

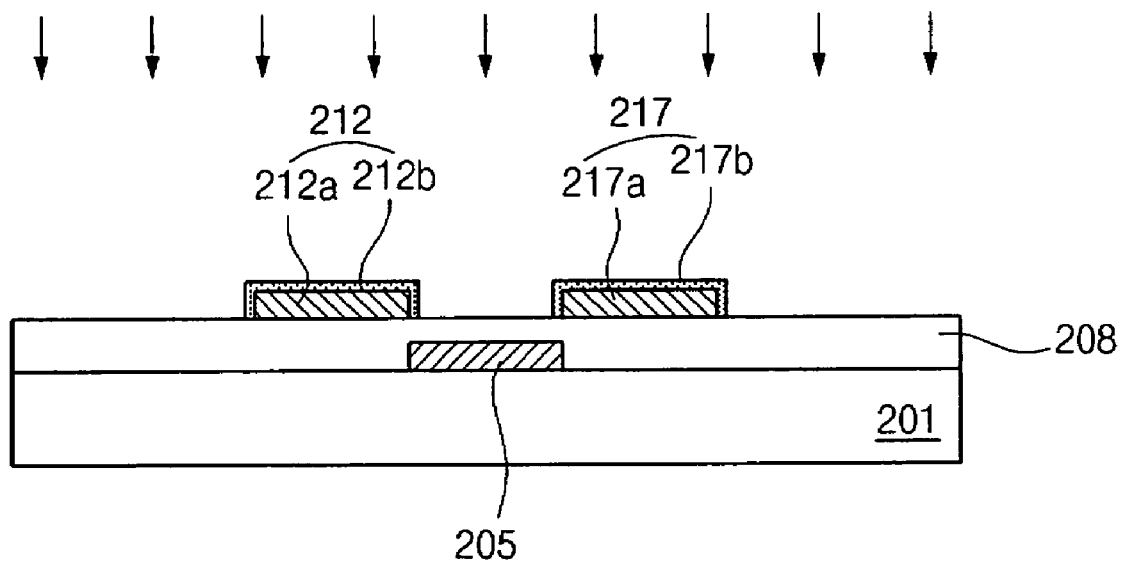
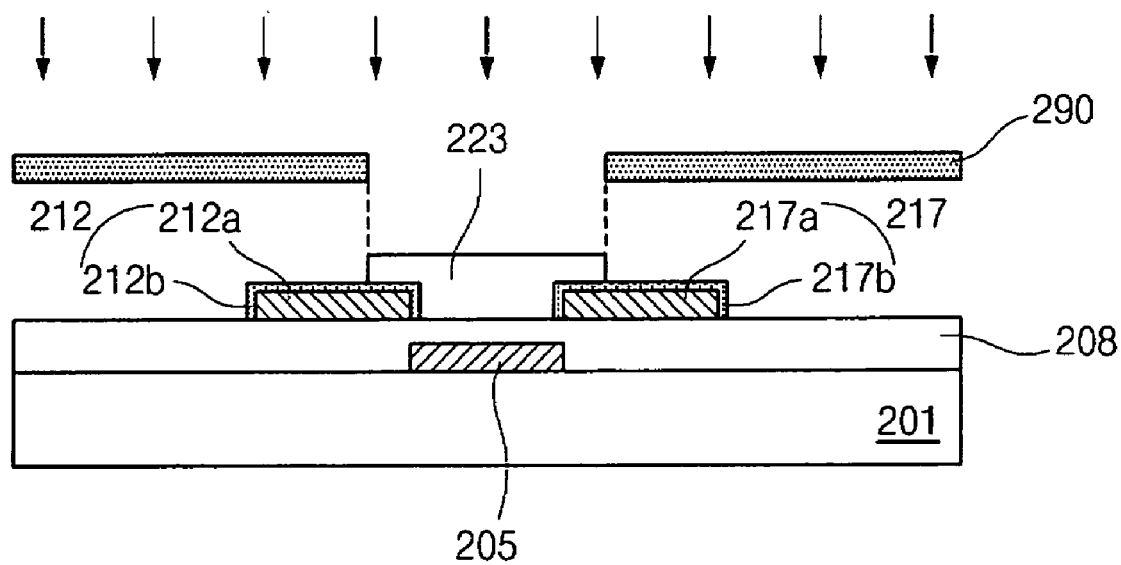

THIN FILM TRANSISTOR INCLUDING ORGANIC SEMICONDUCTOR LAYER AND SUBSTRATE INCLUDING THE SAME

The present invention claims the benefit of Korean Patent Application No. 10-2005-0028348, filed in Korea on Apr. 6, 2005, which is hereby incorporated by reference.

FIELD OF THE INVENTION

The present invention relates to a thin film transistor including an organic semiconductor layer, and more particularly, to an organic thin film transistor including an organic semiconductor layer and an array substrate including the same.

DISCUSSION OF THE RELATED ART

Until recently, display devices have typically used cathode-ray tubes (CRTs). Presently, much effort is being expended to study and develop various types of flat panel displays, such as liquid crystal display (LCD) devices, plasma display panels (PDPs), field emission displays (FED), and electro-luminescence displays (ELDs), as a substitute for CRTs. In particular, these types of flat panel displays have been driven in an active matrix type display in which a plurality of pixels arranged in a matrix form are driven using a plurality of thin film transistors therein. Among the active matrix types of flat panel displays, liquid crystal display (LCD) devices and electroluminescent display (ELD) devices are widely used as monitors for notebook computers and desktop computers because of their high resolution, ability to display colors and superiority in displaying moving images.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field in the direction of the induced electric field, thereby changing the light transmissivity of the LCD device. Thus, the LCD device displays images by varying the intensity of the induced electric field.

FIG. 1 is a perspective view of an LCD device according to the related art. As shown in FIG. 1, the LCD device includes a lower substrate 10, an upper substrate 20 and a liquid crystal material 30. The lower substrate 10 is referred to as an array substrate that includes a gate line 14 and a data line 16 on a first substrate 12 that cross each other to define a pixel region "P". A pixel electrode 18 and a thin film transistor "T", as a switching element, are positioned in each pixel region "P". Thin film transistors "T", which are disposed adjacent to where the gate lines 14 and the data lines 16 cross, are disposed in a matrix form on the first substrate 12. The upper substrate 20 is referred to as a color filter substrate that includes color filter patterns 26 including red (R), green (G) and blue (B) color filter patterns 26a, 26b and 26c, respectively, on a second substrate 22, a black matrix 25 between the color filter patterns 26, and a common electrode 28 on both the color filter pattern 26 and the black matrix 25.

In the above related art LCD device, a hard type substrate such as a glass substrate has been used as each of the first and second substrates. In accordance that small-size portable display devices such as personal digital assistants (PDA) and notebook computers are presently widely used, much effort is being expended to study and develop a flexible substrate such as a plastic substrate having low weight and good flexibility. However, since processes of fabricating the substrate including the thin film transistor are conducted mainly at a high temperature of more than 200 degrees centigrade, it is difficult to use a flexible substrate as the substrate including the thin film transistor, instead of a glass substrate. Accordingly, a flexible substrate is used for the color filter substrate, and a hard type substrate is used for the array substrate.

When fabricating a substrate having the thin film transistor at a temperature of equal to or less than 200 degrees centigrade, electrodes and lines made of a metallic material, an insulating layer, a passivation layer and the like can be formed with low temperature deposition or coating without affecting the thin film transistor properties. However, when a semiconductor layer using amorphous silicon or poly-crystalline silicon is formed at a temperature of equal to or less than 200 degrees centigrade, semiconductor properties including electric conductivity are degraded and have defects, thus, a thin film transistor including it cannot function as a switching element.

Therefore, to overcome the above problems, effort is also being expended to study and develop a method for fabricating a thin film transistor and an array substrate at a low temperature of equal to or less than 200 degrees centigrade by using an organic semiconductor material.

FIG. 2 is a cross-sectional view of a thin film transistor of an array substrate for an LCD device using an organic semiconductor layer according to the related art.

As shown in FIG. 2, a gate electrode 55 and a gate line (not shown) are formed on a plastic substrate 51. Then, a gate insulating layer 58 is formed on the gate electrode 55 and the gate line. Then, gold (Au) is deposited on the gate insulating layer 58 and patterned to form source and drain electrodes 62 and 65 spaced apart from each other and a data line (not shown) connected to the source electrode 62. Then, an organic semiconductor material is deposited and patterned to form an organic semiconductor layer 70. Like this, in the related art, an organic semiconductor material is used to fabricate a thin film transistor and an array substrate at a temperature of equal to or less than 200 degrees centigrade.

As explained above, gold (Au) is used for the source and drain electrodes contacting the organic semiconductor layer 70. The reason for using gold (Au) is that gold (Au) has a high work function and low resistance. In more detail, in general, the source and drain electrodes have been made of silver (Ag), aluminum (Al) and copper (Cu) having low work functions of 4.26 eV, 4.28 eV and 4.65 eV, respectively. However, gold (Au) has a work function of 5.1 eV, which is higher than the above metallic materials. In the related art array substrate, the interface between the organic semiconductor layer and the source and drain electrodes has an energy barrier, and in experiment, the energy barrier decreases as the work function increases. Therefore, gold (Au), having a work function much higher than the above general metallic materials, is used to reduce the interface energy barrier, and thus the thin film transistor having the organic semiconductor layer has good properties.

However, there are some problems when using gold (Au). Due to the fact that gold (Au) is apt to diffuse, it is difficult to set line widths of the source and drain electrodes and the data line. Also, due to the fact that gold (Au) has bad adhesion properties, it can be stripped from the substrate.

Also, when deposition of gold (Au) is performed in a process chamber, gold (Au) can also stick to an inner wall of the process chamber. Accordingly, the stuck gold (Au) drops onto the substrate as an alien substance in another process. Also, because gold (Au) is expensive, the product cost increases.

SUMMARY OF THE INVENTION

By way of introduction only, in one aspect of the present invention, a thin film transistor includes a gate electrode on a substrate; a gate insulating layer on the gate electrode; source and drain electrodes including first source and drain layers on the gate insulating layer, respectively, and spaced apart from each other, wherein at least one of the first source and drain layers include indium-tin-oxide doped with at least one Group III element; and an organic semiconductor layer on the gate insulating layer and contacting the first source and drain layers. Preferably, the first source and drain layers both include indium-tin-oxide doped with at least one Group III element, preferably boron.

In another aspect of the present invention, there is provided a method of fabricating a thin film transistor including forming a gate electrode on a substrate; forming a gate insulating layer on the gate electrode; forming source and drain electrodes including first source and drain layers on the gate insulating layer, respectively, and spaced apart from each other, wherein at least one of the first source and drain layers include indium-tin-oxide doped with at least one Group III element; and forming an organic semiconductor layer on the gate insulating layer and contacting the first source and drain layers.

In another aspect of the present invention an array substrate includes a gate electrode on a substrate; a gate insulating layer on the gate electrode; source and drain electrodes including first source and drain layers on the gate insulating layer, respectively, and spaced apart from each other, wherein at least one of the first source and drain layers include indium-tin-oxide doped with at least one Group III element; an organic semiconductor layer on the gate insulating layer and contacting the first source and drain layers; and a data line connected to the source electrode.

In another aspect of the present invention, there is provided a method of fabricating an array substrate including forming a gate electrode on a substrate; forming a gate insulating layer on the gate electrode; forming source and drain electrodes including first source and drain layers on the gate insulating layer, respectively, and spaced apart from each other, wherein at least one of the first source and drain layers include indium-tin-oxide doped with at least one Group III element; forming an organic semiconductor layer on the gate insulating layer and contacting the first source and drain layers; and forming a data line connected to the source electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 3A to 3G are cross-sectional views of a method of fabricating an array substrate including a thin film transistor using an organic semiconductor material according to a first exemplary embodiment of the present invention.

FIGS. 4A to 4H are cross-sectional views of a method of fabricating an array substrate including a thin film transistor using an organic semiconductor material according to a second exemplary embodiment of the present invention.

DETAILED DESCRIPTION OF THE PREFERRED EMBODIMENTS

Reference will now be made in detail to the illustrated embodiments of the present invention, which are illustrated in the accompanying drawings.

FIGS. 3A to 3G are cross-sectional views of a method of fabricating an array substrate including a thin film transistor using an organic semiconductor material according to a first exemplary embodiment of the present invention.

Figure 1:
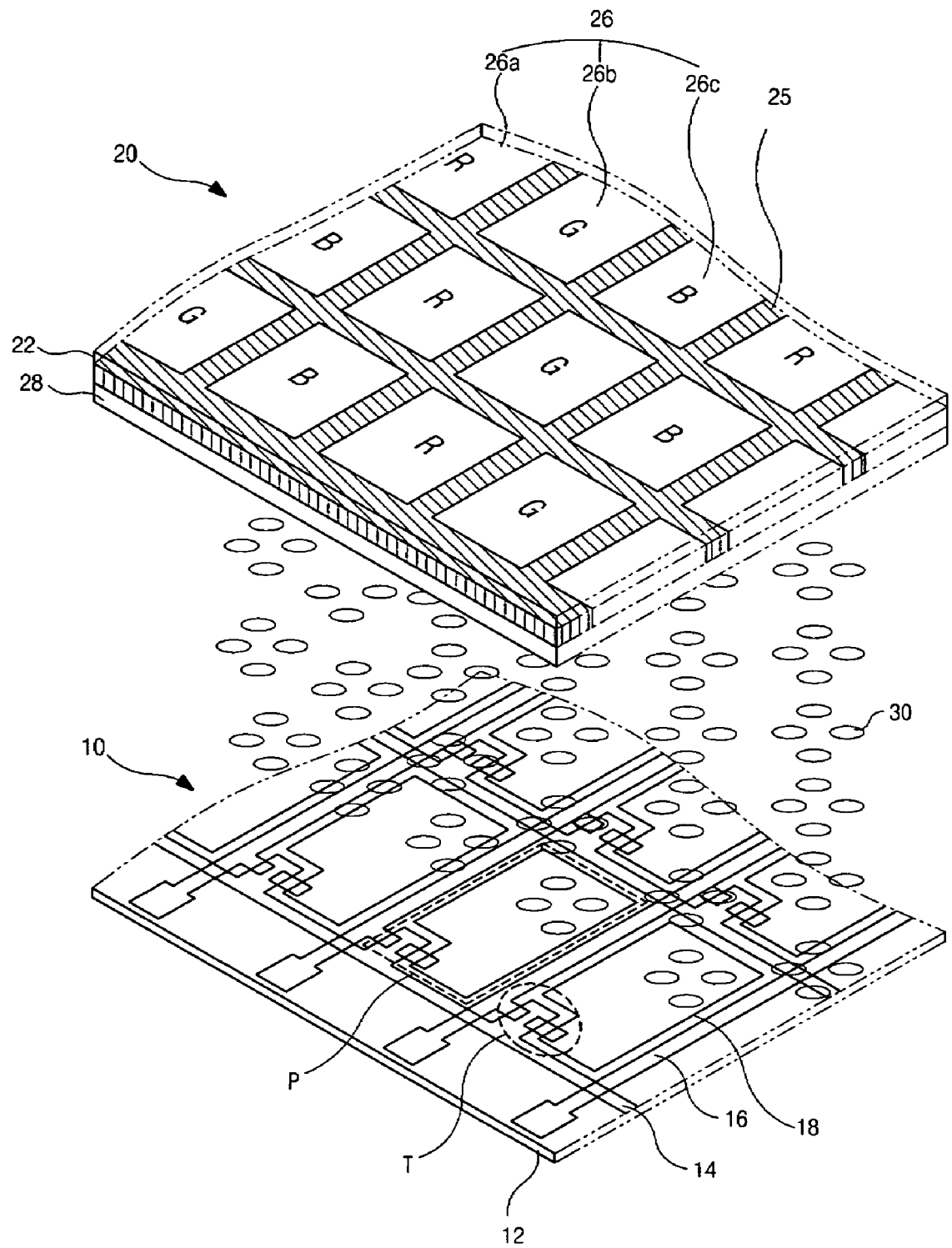
FIG. 1 is a perspective view of an LCD device according to the related art.
Figure 2:
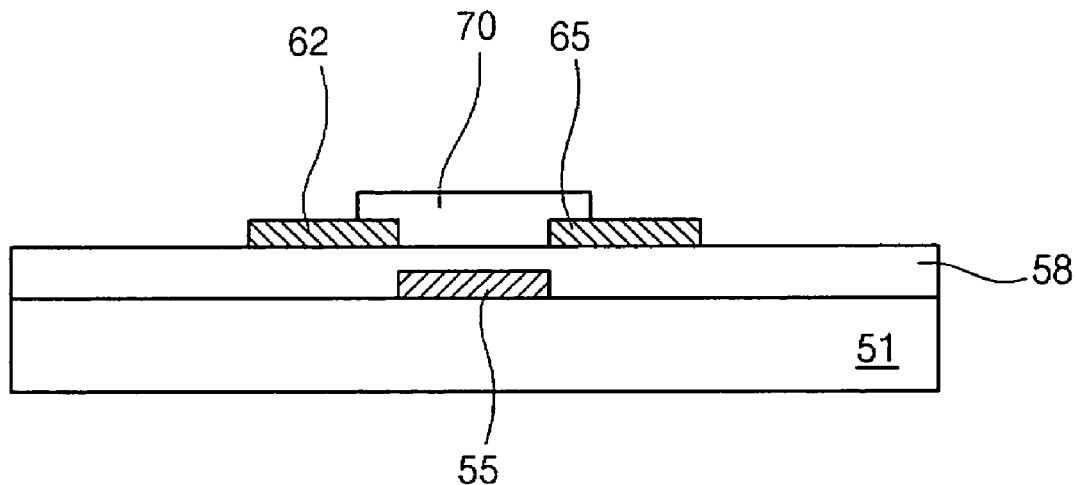
FIG. 2 is a cross-sectional view of a thin film transistor of an array substrate for an LCD device using an organic semiconductor layer according to the related art.
Figure 3A:
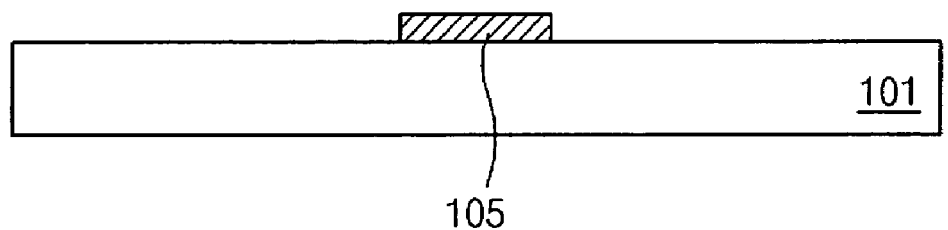

As shown in FIG. 3A, a metallic material is deposited on a substrate 101 and patterned to form a gate electrode 105 and a gate line (not shown). The substrate 101 may be a flexible type substrate such as a plastic substrate or a hard type substrate such as a glass substrate. The metallic material may be deposited with a sputtering method at a temperature of equal to or less than 200 degrees centigrade. A photolithography process, including photoresist-depositing, light-exposing, and developing, may be performed for the deposited metallic material, and then the deposited metallic material may be etched and the photoresist may be stripped, thereby forming the gate electrode 105. A process including the photolithography process, the etching process and the stripping process may be referred to as a mask process.

Figure 3B:
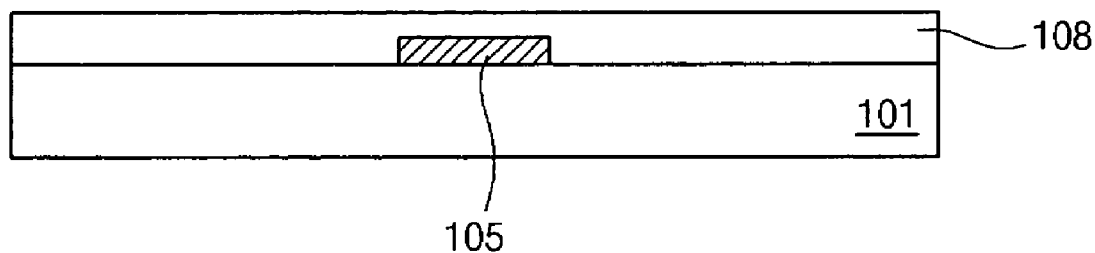

As shown in FIG. 3B, a gate insulating layer 108 is formed on the entire substrate 101 having the gate electrode 105 and the gate line (not shown) at a temperature of equal to or less than 200 degrees centigrade. The gate insulating layer 108 includes at least one organic insulating material such as polyvinylpyrrolidone (PVP) or benzocyclobutene (BCB). Because the gate insulating layer 108 is made of an organic material, the upper surface of the gate insulating layer 108 is even regardless of a step caused by the gate electrode 105.

As shown in FIG. 3C, indium-tin-oxide (ITO) is deposited on the gate insulating layer 108 at a temperature of equal to or less than 200 degrees centigrade and patterned to form source and drain electrodes 112 and 117 and a data line (not shown). The data line is connected to the source electrode 112 and crosses the gate line to define a pixel region. A mask process may be performed for the ITO to form the source and drain electrodes 112 and 117 and the data line, similar to forming the gate electrode 105 and the gate line. Because the upper surface of the gate insulating layer 108 is even, the source and drain electrodes 112 and 117 and the data line do not have steps but are even.

As shown in FIG. 3D, an ion doping process is performed on the entire substrate 101 having the source and drain electrodes 112 and 117. A Group III element, for example, boron (B), may be used for the ion doping process with a dose amount of about $1*10^{14}$ to $9*10_{14}$ ions/cm$^2$. However, other Group III elements, such as aluminum, gallium, indium and thallium, may be used. Pure ITO has a work function of about 4.6 eV to 4.7 eV, and the present doped ITO has a work function of about 4.8 eV to 4.9 eV. Thus, the doped ITO has a work function that is increased by about 0.2 eV compared to pure ITO. Then, a heat treatment is performed at a temperature of equal to or less than 200 degrees centigrade to smooth the surfaces of the source and drain electrodes 112 and 117.

Figure 3E:
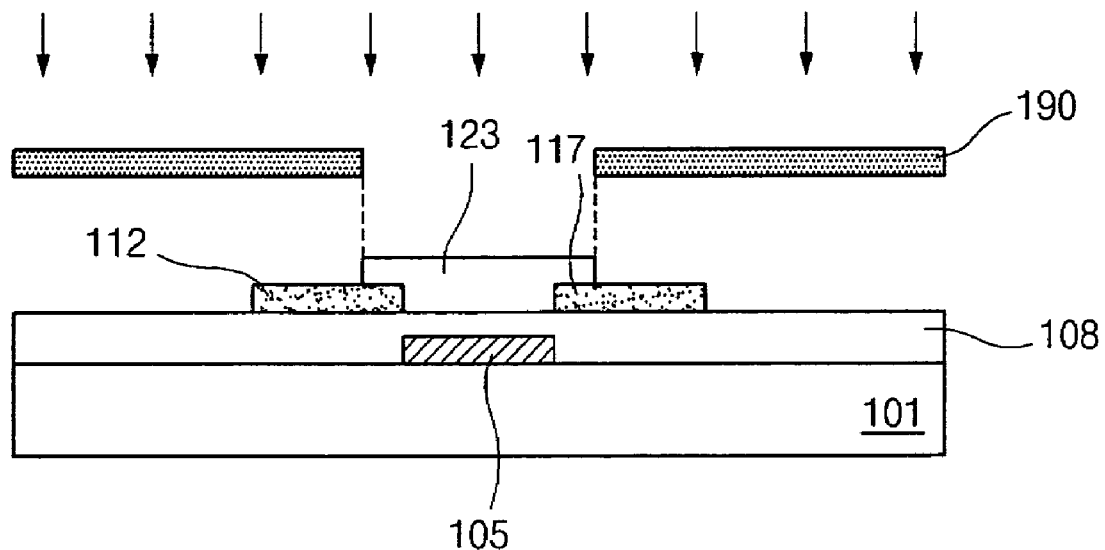

As shown in FIG. 3E, the substrate 101 having the doped source and drain electrodes 112 and 117 and the data line is moved into a process chamber (not shown), and then, an organic semiconductor material is deposited on the substrate 101 to form an organic semiconductor layer 123. The organic semiconductor layer 123 preferably substantially fills the space between the source and drain electrodes 112 and 117 and preferably overlaps at least a part of the source and drain electrodes 112 and 117.

To form the organic semiconductor layer 123, the organic semiconductor material is evaporated at a temperature of equal to or less than 200 degrees centigrade and the evaporated organic semiconductor material is deposited on the substrate 101 having the source and drain electrodes 112 and 117 and the data line using a shadow mask 190. The shadow mask 190 prevents the evaporated organic semiconductor material from being deposited at an undesirable position. Because the organic semiconductor layer 123 is formed of an organic material, it has an even upper surface. The organic semiconductor material may include one or more of pentacene, an arylamine, a thiophene, tetracene, a naphthalene and an anthracene. Pentacene is a p-type organic semiconductor material, and tetracene, naphthalene and anthracene are p-type or n-type organic semiconductor materials.

By way of the above processes, a thin film transistor including a gate electrode 105, source and drain electrodes 112 and 117 and an organic semiconductor layer 123 is formed.

Figure 3F:
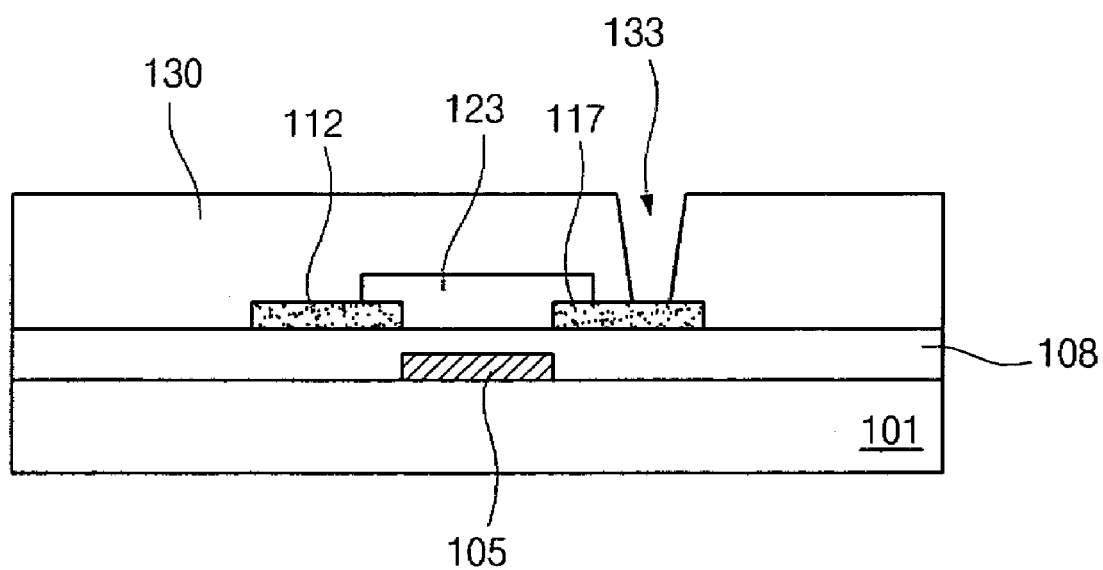

As shown in FIG. 3F, a passivation layer 130 is formed on the entire substrate 101 having the organic semiconductor layer 123 at a temperature of equal to or less than 200 degrees centigrade. The passivation layer 130 may include an organic insulating material or an inorganic insulating material. Then, the passivation layer 130 is patterned to form a drain contact hole 133 exposing at least a part of the drain electrode 117.

Figure 3G:
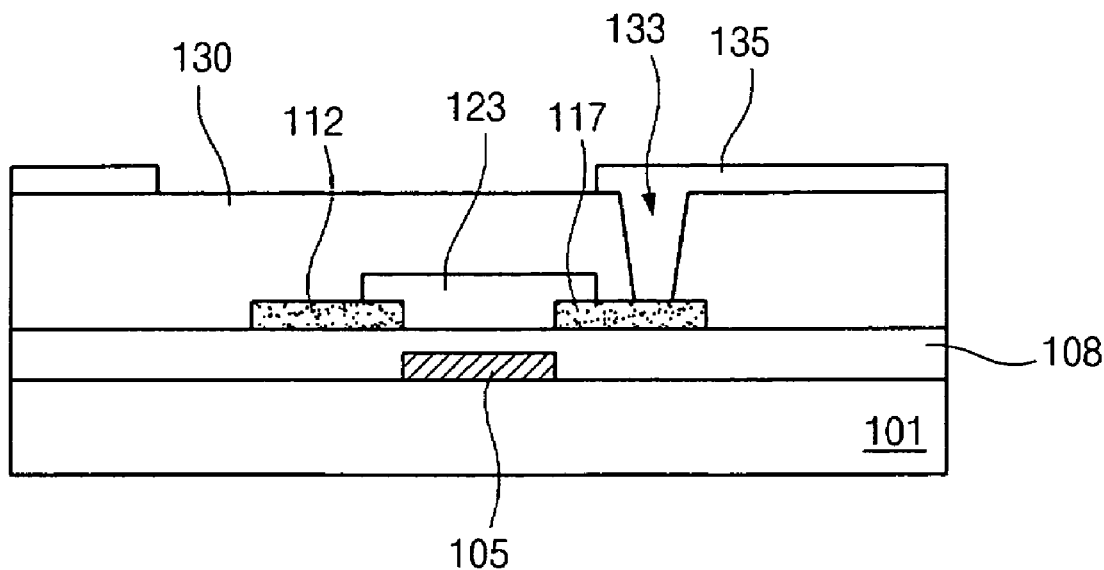

As shown in FIG. 3G, a transparent conductive material is deposited on the passivation layer 130 and patterned with a mask process to form a pixel electrode 135 contacting the drain electrode 117 through the drain contact hole 133. The pixel electrode 135 is formed in each pixel region defined by the crossed gate and data lines. The transparent conductive material may include one or more of indium-tin-oxide (ITO), indium-zinc-oxide (IZO) and indium-tin-zinc-oxide (ITZO).

By way of the above processes, an array substrate including a thin film transistor according to a first exemplary embodiment of the present invention is fabricated.

As explained above, the ITO used for the source and drain electrodes and the data line is doped with boron (B), and thus, the work function of the doped ITO increases compared to pure ITO. Such a work function of doped ITO is greater than the general metallic materials such as silver (Ag), aluminum (Al) and copper (Cu), and is close to the work function of gold (Au). Accordingly, similar to using gold (Au), the energy barrier of the interface between the organic semiconductor layer and the source and drain electrodes made of doped ITO is minimized.

Further, because ITO has good adhesion properties, it cannot be easily removed from the array substrate. Also, because ITO does not easily diffuse, the line width of the data line and the source and drain electrodes can be precisely made. Also, because ITO is cheaper than gold (Au), the product cost can be reduced.

In addition, in an exemplary embodiment, boron (B) may be used for the doping process. Because pentacene is a p-type semiconductor material and tetracene, naphthalene and anthracene can be used as p-type semiconductor materials, boron (B) is an adequate material to dope ITO. Further, doped ITO has a rough surface due to the doping process. Experimentally, boron (B) is a more adequate material to have a rough surface recover into a smooth surface compared to other Group III elements. Therefore, the interface property can be much improved by using boron (B).

FIGS. 4A to 4H are cross-sectional views of a method of fabricating an array substrate including a thin film transistor using an organic semiconductor material according to a second exemplary embodiment of the present invention. The second exemplary embodiment is similar to the first exemplary embodiment, except for adding a low resistance layer for the source and drain electrodes. Accordingly, explanations of parts similar to parts of the first exemplary embodiment are omitted.

Figure 4A:
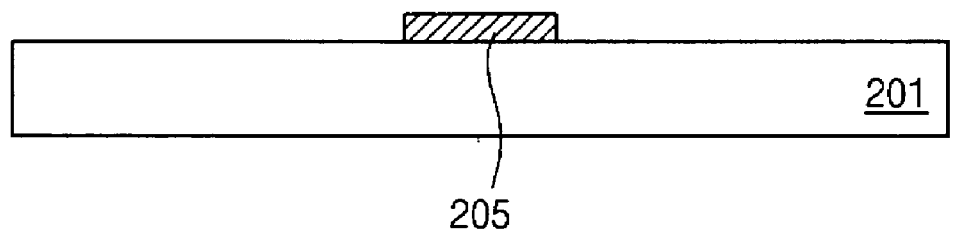

As shown in FIG. 4A, a metallic material is deposited on a substrate 201 and patterned to form a gate electrode 205 and a gate line (not shown). The substrate 201 may be a flexible type substrate such as a plastic substrate or a hard type substrate such as a glass substrate. The metallic material may be deposited with a sputtering method at a temperature of equal to or less than 200 degrees centigrade. To form the gate electrode 205 and the gate line (not shown), a mask process may be performed.

Figure 4B:
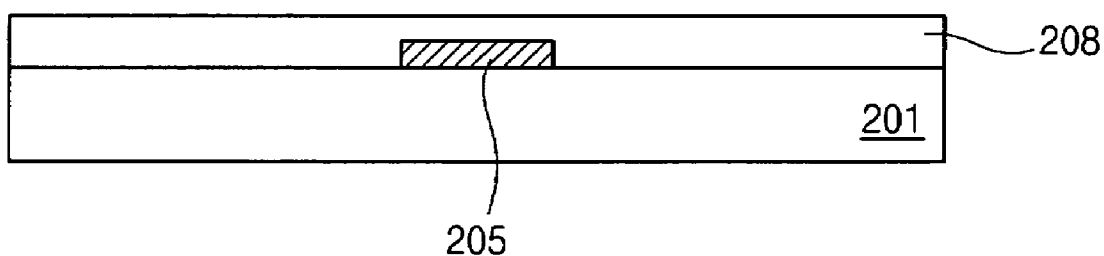

As shown in FIG. 4B, a gate insulating layer 208 is formed on the entire substrate 201 having the gate electrode 205 and the gate line (not shown) at a temperature of equal to or less than 200 degrees centigrade. The gate insulating layer 208 includes at least one organic insulating material such as polyvinylpyrrolidone (PVP) or benzocyclobutene (BCB).

Figure 4C:
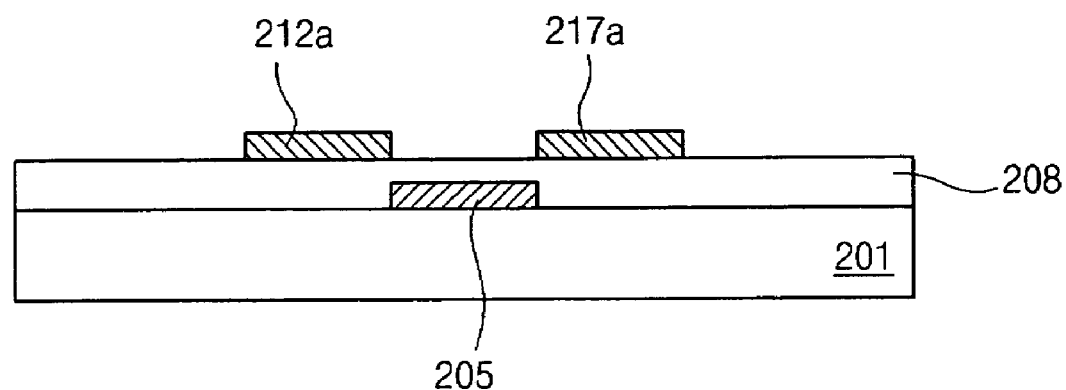

As shown in FIG. 4C, a low resistance metallic material is deposited on the gate insulating layer 208 and patterned to form first source and drain layers 212a and 217a and a data line (not shown). The low resistance metallic material may include at least one of aluminum (Al), aluminum alloy (AlNd), molybdenum (Mo), molybdenum alloy, copper (Cu) and copper alloy.

Figure 4D:
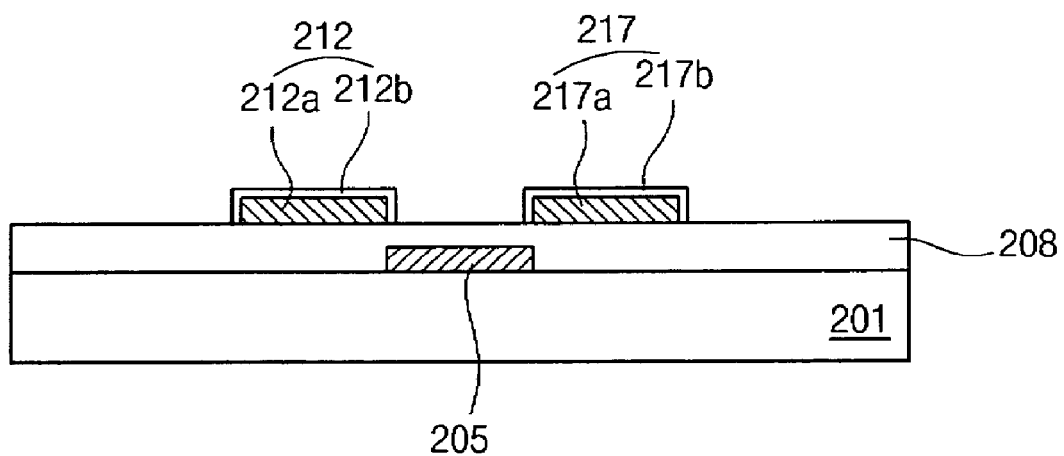

Then, as shown in FIG. 4D, indium-tin-oxide (ITO) is deposited on the substrate 201 having the first source and drain layers 212a and 217a and patterned to form second source and drain layers 212b and 217b. The second source and drain layers 212b and 217b may substantially cover the first source and drain layers 212a and 217a, respectively. The first source and drain layers 212a and 217a have a work function lower than the second source and drain layers 212b and 217b.

The source electrode, which includes both the first and second source layers, is collectively referenced as 212. The drain electrode, which includes both the first and second drain layers, is collectively referenced as 217. That is, the source electrode 212 has a double-layered structure of the first and second source layers 212a and 212b, and the drain electrode 217 has a double-layered structure of the first and second drain layers 217b and 217b.

Then, as shown in FIG. 4E, an ion doping process is performed on the entire substrate 201 having the second source and drain layers 212b and 217b. A Group III element, for example, boron (B), may be used for the ion doping process with a dose amount of about $1*10^{14}$ to $9*10^{14}$ ions/cm$^2$. The doped ITO has a work function of about 4.8 eV to 4.9 eV, which is increased by 0.2 eV more than pure ITO. Then, a heat treatment is performed at a temperature of equal to or less than 200 degrees centigrade to smooth the surface of the second source and drain layers 212b and 217b.

As explained above, because the data line is made of a low resistance metallic material, data signal delay can be prevented. When the size of the LCD device increases, if the resistance of the data line is high, a problem is caused that the data signal transferred along the data line is delayed. Therefore, the data line of a low resistance metallic material can effectively prevent data signal delay. It should be understood that the data line can further include an upper layer, such as a doped ITO layer, on the low resistance metallic layer.

Also, because the source and drain electrodes have the second source and drain layers of doped ITO having a high work function, the interface energy barrier between the organic semiconductor layer and the source and drain electrodes can be minimized.

In this way, since a low resistance metallic material and doped ITO are used for the source and drain electrodes and the data line, reduction of signal delay along with minimization of the interface energy barrier can be effectively achieved.

As shown in FIG. 4F, an organic semiconductor material is deposited on the substrate 201 having the source and drain electrodes 212 and 217 and the data line to form an organic semiconductor layer 223. To form the organic semiconductor layer 223, the organic semiconductor material is evaporated at a temperature of equal to or less than 200 degrees centigrade and the evaporated organic semiconductor material is deposited using a shadow mask 290. The organic semiconductor material may include at least one of pentacene, tetracene, naphthalene and anthracene.

By way of the above processes, a thin film transistor including a gate electrode 205, source and drain electrodes 212 and 217 and an organic semiconductor layer 223 is formed.

Figure 4G:
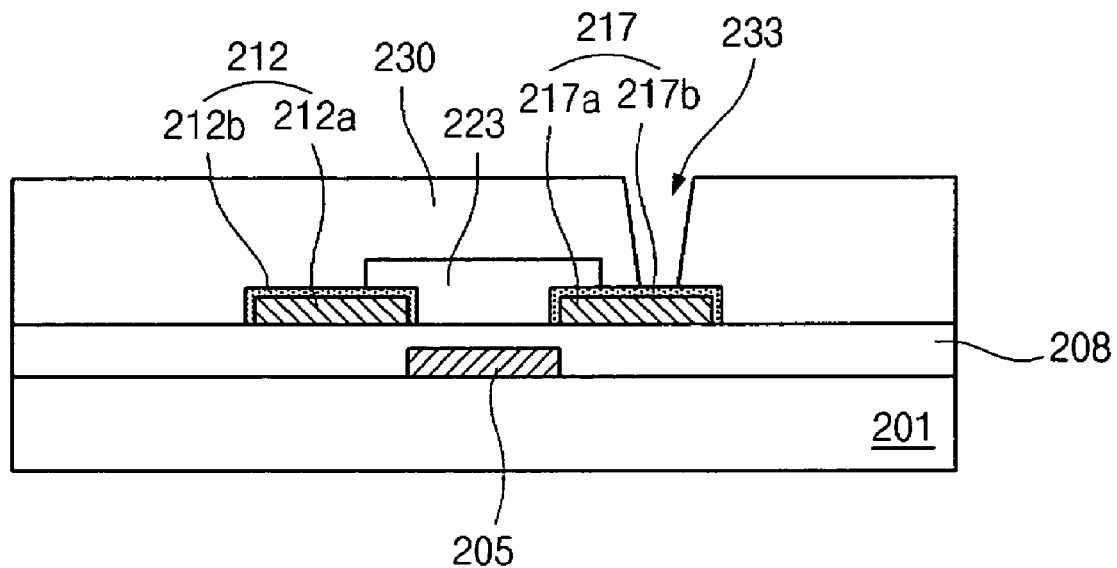

As shown in FIG. 4G, a passivation layer 230 is formed on the entire substrate 201 having the organic semiconductor layer 223. The passivation layer 230 may include an organic insulating material or an inorganic insulating material. Then, the passivation layer 230 is patterned to form a drain contact hole 233 exposing a part of the drain electrode 217.

Figure 4H:
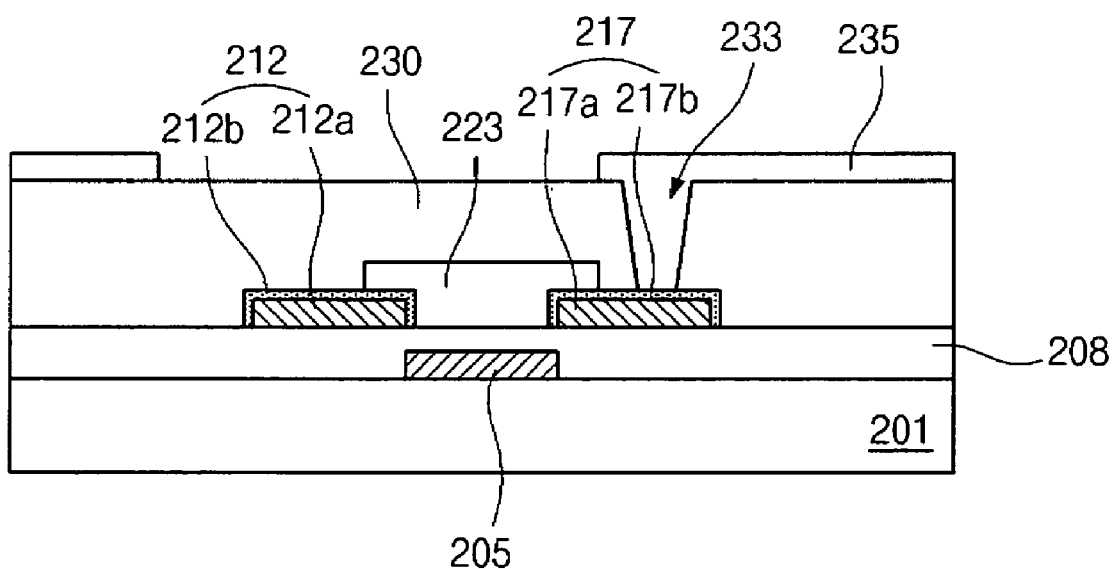

As shown in FIG. 4H, a transparent conductive material is deposited on the passivation layer 230 and patterned to form a pixel electrode 235 contacting the drain electrode 217 through the drain contact hole 233. The pixel electrode 235 is formed in each pixel region defined by the crossed gate and data lines.

By way of the above processes, an array substrate including a thin film transistor according to the second exemplary embodiment is fabricated.

In the above exemplary embodiments, an array substrate for a LCD device using an organic semiconductor material is mainly explained. Also, the present invention can be applicable to other substrates using organic semiconductor materials.

It will be apparent to those skilled in the art that various modifications and variations can be made in the thin film transistor having the organic semiconductor layer, the method of fabricating the thin film transistor, the substrate including the thin film transistor and the method of fabricating the substrate of the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate, comprising:
    forming a gate electrode on a substrate;
    forming a gate insulating layer on the gate electrode;
    forming source and drain electrodes comprising first source and drain layers on the gate insulating layer, respectively, and second source and drain layers on the source and drain layers, respectively, and spaced apart from each other, wherein at least one of the second source and drain layers comprises indium-tin-oxide doped with at least one Group III element;
    forming an organic semiconductor layer on the gate insulating layer and contacting the second source and drain layers; and
    forming a data line connected to the source electrode,
    wherein the at least one Group III element includes boron (B),
    wherein the first source and drain layers have a resistance lower than a resistance of the second source and drain layers,
    wherein the second source and drain layers fully cover the first source and drain layers, respectively,
    wherein a top surface of the gate insulating layer is even, whereby the source and drain electrodes and the data line directly on the gate insulating layer are even,
    wherein the data line consists of a layer made of the same material as the first source and drain layers, and
    wherein a heat-treating step is conducted prior to forming the organic semiconductor layer such that surfaces of the second source and drain layers are smoothed, and a temperature of the heat-treating is equal to or less than 200 degrees centigrade.

2. The method according to claim 1, wherein said second source and drain layers both comprise indium-tin-oxide doped with at least one Group III element.

3. The method according to claim 1, wherein the data line, the first source layer and the first drain layer are formed in the same step.

4. The method according to claim 1, further comprising forming a. passivation layer having an drain contact hole exposing a part of the drain electrode and forming a pixel electrode contacting the part of the drain electrode through the drain contact hole.

5. The method according to claim 1, wherein the substrate comprises a glass substrate or a plastic substrate.

6. The method according to claim 1, wherein all steps of fabricating the array substrate are performed at equal to or less than 200 degrees centigrade.

* * * * *